(12) United States Patent
Townsend et al.

(10) Patent No.: US 11,143,669 B2
(45) Date of Patent: Oct. 12, 2021

(54) INERTIAL MEASUREMENT UNITS

(71) Applicant: Atlantic Inertial Systems, Limited, Plymouth (GB)

(72) Inventors: Kevin Townsend, Liskeard (GB); Michael Terence Durston, Plymouth (GB)

(73) Assignee: ATLANTIC INERTIAL SYSTEMS, LIMITED, Plymouth (GB)

( * ) Notice: Subject to any disclaimer, the term of this patent is extended or adjusted under 35 U.S.C. 154(b) by 154 days.

(21) Appl. No.: 16/261,862

(22) Filed: Jan. 30, 2019

(65) Prior Publication Data

US 2019/0265268 A1     Aug. 29, 2019

(30) Foreign Application Priority Data

Feb. 23, 2018 (GB) ...................................... 1802986

(51) Int. Cl.
| | |
|---|---|
| *G01P 15/08* | (2006.01) |
| *G01P 1/02* | (2006.01) |
| *B81B 7/00* | (2006.01) |
| *G01C 19/5783* | (2012.01) |
| *G01C 21/16* | (2006.01) |

(52) U.S. Cl.
CPC ........ *G01P 15/0802* (2013.01); *B81B 7/0074* (2013.01); *G01C 19/5783* (2013.01); *G01C 21/16* (2013.01); *G01P 1/023* (2013.01)

(58) Field of Classification Search
CPC . G01P 15/0802; G01P 1/023; G01C 19/5783; G01C 21/16; B81B 7/0074
See application file for complete search history.

(56) References Cited

U.S. PATENT DOCUMENTS

| | | | | |
|---|---|---|---|---|
| 4,656,750 | A | | 4/1987 | Pitt et al. |
| 4,711,125 | A | * | 12/1987 | Morrison ................. G01P 15/18 |
| | | | | 73/178 R |
| 8,368,154 | B2 | * | 2/2013 | Trusov .................... G01C 21/16 |
| | | | | 257/417 |

(Continued)

FOREIGN PATENT DOCUMENTS

| | | |
|---|---|---|
| CN | 101290227 A | 10/2008 |
| CN | 101922938 A | 12/2010 |

OTHER PUBLICATIONS

In Inertial Sensors & Systems (ISISS), 2016 International Symposium, IEEE, 2016 International Symposium, IEEE, 2016, Zhu Weibin Casey S. Wallace, & Navid Yazdi, "A Tri-fold Inertial Measurement Unit Fabricated with a Batch 3-D Assembly Process", pp. 70-73.

(Continued)

*Primary Examiner* — Francis C Gray
(74) *Attorney, Agent, or Firm* — Cantor Colburn LLP (57) ABSTRACT

A method of manufacturing an inertial measurement unit (IMU) comprises fabricating a plurality of individual MEMS inertial sensor packages at a package level as sealed packages containing a MEMS inertial sensor chip and an integrated circuit electrically connected together. Fabricating the individual MEMS inertial sensor packages comprises forming mechanical interconnect features in each package and assembling the IMU by mechanically interconnecting each individual MEMS inertial sensor package with another individual MEMS inertial sensor package in a mutually orthogonal orientation.

17 Claims, 7 Drawing Sheets

(56) References Cited

U.S. PATENT DOCUMENTS

| | | |
|---|---|---|
| 8,887,566 B1 | 11/2014 | Tanenhaus |
| 9,116,510 B1 | 8/2015 | Justin et al. |
| 9,232,681 B2 * | 1/2016 | Leigh .................. H01R 12/712 |
| 2004/0169244 A1 * | 9/2004 | MacGugan ............. G01P 15/18 257/416 |
| 2006/0042382 A1 * | 3/2006 | DCamp .................. G01P 1/023 73/493 |
| 2008/0269976 A1 | 10/2008 | Birgersson |
| 2009/0288485 A1 | 11/2009 | Ell et al. |
| 2012/0032286 A1 * | 2/2012 | Trusov .................. G01C 21/16 257/417 |
| 2012/0286380 A1 * | 11/2012 | Yazdi ...................... G01P 15/18 257/415 |
| 2014/0224018 A1 | 8/2014 | Whitesides |
| 2018/0238930 A1 * | 8/2018 | Nguyen ............... G01C 21/165 |

OTHER PUBLICATIONS

In Inertial Sensors and Systems (ISISS), 2014 International Symposium, IEEE, 2014, Zhu Weibin Yafan Zhand, and Navid Yazdi, "A Batch-Mode Assembly and Packaging Technology for 3-Axis Trifold Inertial Measurement Units", pp. 1-4.

Intellectual Property Search Report for GB Application No. 1802986.8 dated Aug. 1, 2018, 5 pages.

* cited by examiner

INERTIAL MEASUREMENT UNITS

FOREIGN PRIORITY

This application claims priority to GB Patent Application No. 1802986.8 filed Feb. 23, 2018, the entire contents of which is incorporated herein by reference.

TECHNICAL FIELD

The present disclosure relates to inertial measurement units and methods of manufacturing the same.

BACKGROUND

Microelectromechanical systems (MEMS) inertial sensors, typically fabricated from a single silicon wafer, can be used to measure linear or angular motion without a fixed point of reference. MEMS gyroscopes, or strictly speaking MEMS angular rate sensors, can measure angular rate by observing the response of a vibrating structure to Coriolis force. MEMS accelerometers can measure linear acceleration by observing the response of a proof mass suspended on a spring. MEMS inertial sensors are often assembled into groups to make multi-axis systems. Typically an Inertial Measurement Unit (IMU) contains one or more gyroscopes and/or accelerometers—for example an IMU may contain three gyroscopes and three accelerometers such that the IMU can detect angular rates around, and linear accelerations in, each of the x-, y-, and z-axes. For high performance multi-axis inertial measurement systems, three or six individual single axis inertial sensors need to be accurately orthogonally mounted. This adds significantly to the size and cost of the system. Each MEMS sensor package may be mounted to a host structure provided by the IMU. The host structure is often a ceramic or polymeric support that mechanically mounts the MEMS sensor packages and also provides for electrical connections to each package. However it can be difficult to achieve mutual orthogonality between the mounted sensors that is accurate and stable.

US 2004/0169244 discloses an IMU having individually hermetically sealed packaged MEMS inertial sensors mounted in recesses on the faces of a cubic ceramic mounting block. Electrical interface contacts are provided on the surfaces of the cubic block so as to allow for electrical communication with each MEMS sensor package. Electrical power and operational signal lines are brought to the interface contacts over external surfaces of the cubic block.

The present disclosure seeks to provide improved ways of manufacturing inertial measurement systems and improvements in inertial measurement units.

SUMMARY

According to a first aspect of the present disclosure there is provided a method of manufacturing an inertial measurement unit (IMU). The method includes: fabricating a plurality of individual MEMS inertial sensor packages at a package level as sealed packages containing a MEMS inertial sensor chip and an integrated circuit electrically connected together, wherein fabricating the individual MEMS inertial sensor packages comprises forming mechanical interconnect features in each package; and assembling the IMU by mechanically interconnecting each individual MEMS inertial sensor package with another individual MEMS inertial sensor package in a mutually orthogonal orientation.

Such methods allow for individual MEMS inertial sensor packages to be directly orthogonally mounted to one another, with the mechanical interconnect features in each package providing for accurate mechanical stability without relying on an underlying mounting block or host structure. Such methods may use standard high volume packaging construction techniques for the MEMS inertial sensor packages, where the individual packages are made simultaneously on large sheets and singulated after fabrication. This allows for low cost manufacture. Smaller and cheaper IMUs can be produced by reducing the overall component count.

A further benefit of assembling the IMU by mechanically interconnecting each individual MEMS inertial sensor package directly with another is that the IMU structure is much more uniform in its material composition. As compared to an IMU wherein sensor packages are mounted to an underlying support structure, there are no dissimilar material junctions as arise when a ceramic package is mounted to the plastics or composite material (e.g. FR4 fibreglass) of a printed circuit board. This means that many of the performance problems typically suffered due to differential expansion can be avoided.

The Applicant has recognised that assembling complete individual MEMS inertial sensor packages into an IMU allows for each package to be individually tested to determine its functionality and performance before the packages are assembled into an IMU configuration. Thus, in at least some examples, the method further comprises testing each of the plurality of individual MEMS inertial sensor packages before assembling the IMU. This is particularly important for high performance IMU systems where only selected, fully functional and high performance, sensor devices are chosen to be assembled into an IMU. For example, all six sensors in a cubic IMU can be chosen to have similarly high performance levels.

The mechanical interconnect features may be formed in any suitable way in each package during its fabrication. In at least some examples, fabricating the individual MEMS inertial sensor packages comprises layer-by-layer fabrication. This is a proven manufacturing technique, e.g. for ceramic packages, that allows a package to be built up from layers that are stamped out from sheets. The individual packages may be manufactured using standard ceramic packaging techniques, wherein each package comprises a stack of several separately manufactured ceramic layers. The stack may then be laminated and sintered to form a single ceramic structure. However the Applicant has recognised that by designing one or more of the layers to have a different shape it is possible to create the mechanical interconnect features in each package without any major changes to the overall fabrication process. Thus fabricating the individual MEMS inertial sensor packages may comprise stacking a plurality of package layers comprising one or more base layers and one or more further layers having a different shape to the one or more base layers. Preferably the mechanical interconnect features are formed as a result of the different shape of the one or more further layers.

During the fabrication stage, the mechanical interconnect features may be formed at any suitable position in the individual packages. However it may be convenient from an assembly point of view for the mechanical interconnect features to be formed at one or more edges of each package. Furthermore, in examples where the packages are fabricated layer-by-layer, the Applicant has realised that it can be beneficial to form the mechanical interconnect features at one or more edges of each package e.g. as a result of stamping out a different shape for the further layer(s).

The mechanical interconnect features may have any suitable interlocking shape. Some interlocking shapes may allow one mechanical interconnect feature to interlock with another mechanical interconnect feature having the same interlocking shape. However, in at least some examples, the mechanical interconnect features may have male and female forms. For example, the mechanical interconnect features in each package may comprise at least one interlocking portion and at least one corresponding interlocking channel. What is meant by a corresponding interlocking channel is a channel that is shaped and/or dimensioned to receive an interlocking portion in an interlocking manner. For example, the interlocking portion may fill the interlocking channel so as to prevent any relative movement between the packages so interlocked. The interlocking channel could be defined between wall portions of the package.

The step of assembling the IMU may comprise mechanically interconnecting an interlocking portion of one package with a corresponding interlocking channel of another package.

In such examples, the mechanical interconnect features may comprise interlocking portions and interlocking channels on alternate edges of each package. This means that the orientation of the package determines whether a 'male' interlocking portion or 'female' interlocking channel is presented at any given edge to another package.

The geometry of a given package will determine the number and arrangement of the mechanical interconnect features. In at least some examples, each package may comprise interlocking portions arranged at a first axis and interlocking channels arranged at a second axis at an angle to the first axis. For example, a square or rectangular package may have interlocking portions arranged at the first x-axis and interlocking channels arranged at the second y-axis at 90° to the x-axis. In another example, a hexagonal package may have interlocking portions arranged at a first axis and interlocking channels arranged at a second axis at 60° to the first axis.

The Applicant has recognised that another benefit of layer-by-layer fabrication is that multiple packages may conveniently be fabricated in a single consolidated sheet. This can enable a more efficient manufacturing process in terms of speed and material wastage. In addition, or as an alternative, to any of the examples disclosed above, fabricating the individual MEMS inertial sensor packages may comprise stacking a plurality of package layers, each package layer comprising multiple package layers formed in a sheet, to fabricate multiple packages in a single consolidated sheet. The individual packages may then be singulated from the single consolidated sheet. This takes place before the step of assembling the IMU. Typically the singulation or separation of individual packages also takes place before the MEMS inertial sensor chip and integrated circuit are sealed into each package. In such examples, the MEMS inertial sensor chip and integrated circuit are assembled into the individual single packages and the packages then individually sealed. The electrical connections between the MEMS inertial sensor chip and integrated circuit may already be present in the singulated package, for example, metallic tracking may be added when stacking the package layers to produce internal electrical connections or "vias" within the package.

It will be appreciated that fabrication results in a plurality of completely separate, individual MEMS inertial sensor packages. There are no hinged connections between the packages when the IMU is assembled. The mechanical interconnect features can fix the orientation of the packages relative to one another so as to be mutually orthogonal.

The process of fabricating a plurality of individual MEMS inertial sensor packages at a package level as sealed packages may comprise any one or more suitable sealing technique(s). The sealed packages may be hermetically sealed. For example, sealing the individual MEMS inertial sensor packages may comprise applying a lid (e.g. a glass, metal or ceramic lid) and/or applying an encapsulation material (such as epoxy potting). Such sealing techniques are well known and can be applied in a conventional manner.

In addition, or as an alternative, to any of the examples disclosed above, fabricating the individual MEMS inertial sensor packages may comprise adding electrical interconnect features to one or more external faces of each package. The electrical interconnect features may, for example, comprise conductive (e.g. metallic) pads supported on external face(s) of each package. The electrical interconnect features may be added to each package using conventional manufacturing techniques. However, a conventional MEMS inertial sensor package is usually designed to be mounted onto a substrate (such as a printed circuit board) rather than directly mounted to another package as in the present disclosure. This means that conventional packages typically have electrical interconnect features added to just one face, for example a rear face of the package that is intended to be soldered onto a substrate. The conductive pads may be exposed at the edges of the rear face, which enables a solder meniscus to form when the rear face is soldered onto a substrate and enables a visual inspection of the solder joint. However, the electrical connection is only through the rear face of the package.

In one or more examples, assembling the IMU comprises electrically connecting each individual MEMS inertial sensor package with another individual MEMS inertial sensor package. In some examples the packages may be assembled into an IMU with separate electrical connections running between the electrical interconnect features of each package, for example flying leads indirectly joining the conductive pads of one package to another. However, the Applicant has recognised that, when mechanically interconnecting individual MEMS inertial sensor packages together to assemble an IMU, it can be desirable to directly connect the packages together electrically as well as mechanically. Thus, in at least some examples, the method further comprises directly joining the electrical interconnect features of one package to the electrical interconnect features of another package, for example using solder to join the conductive pads together. Furthermore, when the packages are assembled in a mutually orthogonal orientation, it may not be easy to join the electrical interconnect features on a rear face of one package to the electrical interconnect features on a rear face of another mutually orthogonal package. In various examples, directly joining the electrical interconnect features of one package to another may comprise joining a vertical side face of one package to a horizontal side face of another package. It is preferable, in at least some examples, for the electrical interconnect features (e.g. conductive pads) to extend along an external face to an edge of the package, to continue across the edge, and to further extend along a side face of the package.

In one or more examples, each individual MEMS inertial sensor package may be electrically connected with one or more others of the plurality of individually fabricated MEMS inertial sensor packages so as to form a bus for the transfer of power and/or data between the packages. For example, assembling the plurality of individual MEMS inertial sensor packages into an IMU may result in a single shared bus for the transfer of power and/or data to/from the IMU. This means that the IMU may only require a single communications link to an external IMU control system, rather than separate connections to each package. This is achieved without mounting any of the packages on individual printed circuit boards.

In at least some examples, in addition or alternatively, the method comprises: assembling the IMU by mechanically interconnecting individual MEMS inertial sensor packages to form a three-dimensional IMU structure. As mentioned above, the three-dimensional structure is achieved without an underlying 3D support structure. In some examples, the IMU is assembled by mechanically interconnecting at least three individual MEMS inertial sensor packages. This can produce an IMU comprising three accelerometer packages (e.g. for measuring linear acceleration along the x-, y- and z-axes) or three gyroscope packages (e.g. for measuring angular rate about the x-, y- and z-axes).

In at least some examples, in addition or alternatively, the method comprises: assembling the IMU by mechanically interconnecting individual MEMS inertial sensor packages to form a closed three-dimensional IMU structure, e.g. a cubic or polyhedral structure. A cubic IMU structure may comprise three accelerometer packages and three gyroscope packages. Or, a cubic IMU structure may comprise six accelerometer or gyroscope packages to give dual redundancy.

The present disclosure extends to an inertial measurement unit (IMU) manufactured as disclosed herein.

According to another aspect of the present disclosure there is provided an inertial measurement unit (IMU). The IMU includes a plurality of individually fabricated MEMS inertial sensor packages. Each package is individually fabricated at a package level as a sealed package containing a MEMS inertial sensor chip and an integrated circuit electrically connected together. Each individually fabricated MEMS inertial sensor package comprises mechanical interconnect features arranged to mechanically interconnect each individual MEMS inertial sensor package with another individual MEMS inertial sensor package in a mutually orthogonal orientation.

Such an IMU may be manufactured using any of the method steps disclosed above. As previously mentioned, it is preferable that each individually fabricated MEMS inertial sensor package further comprises electrical interconnect features on one or more external faces of the package and the electrical interconnect features of one package are directly joined to the electrical interconnect features of another package. For example, the electrical interconnects may be directly joined from a vertical side face of one package to a horizontal side face of another package (e.g. by solder joints between the side faces). An IMU having such direct mechanical and electrical interconnections between individually fabricated MEMS inertial sensor packages is considered unique.

In at least some examples, in addition or alternatively, each individual MEMS inertial sensor package is electrically connected with one or more others of the plurality of individually fabricated MEMS inertial sensor packages so as to form a bus for the transfer of power and/or data between the packages.

In the IMU, each sealed package contains a MEMS inertial sensor chip and an integrated circuit electrically connected together. The package may comprise one or more internal cavities containing the MEMS inertial sensor chip and the integrated circuit. In examples wherein the MEMS inertial sensor chip and the integrated circuit are contained in separate cavities, the package may comprise electrical connections e.g. vias running between the cavities.

The IMU may comprise at least two packages, preferably three packages, mechanically interconnected in a mutually orthogonal orientation. In various examples the IMU has a closed three-dimensional structure, e.g. a cubic or polyhedral structure. As mentioned above, a cubic IMU structure may comprise three accelerometer packages and three gyroscope packages. Or, a cubic IMU structure may comprise six accelerometer or gyroscope packages to give dual redundancy.

In any of the examples disclosed herein, the individual MEMS inertial sensor packages may comprise ceramic packages. Fabricating the individual MEMS inertial sensor packages may comprise stacking a plurality of ceramic package layers.

BRIEF DESCRIPTION OF THE FIGURES

One or more non-limiting examples will now be described, by way of example only, and with reference to the accompanying figures, in which:

FIG. 3 is an alternative cross-sectional view of the individual MEMS inertial sensor package shown in FIG. 2a;

FIG. 5a shows a sheet of 16 layers as seen in FIG. 4a;

DETAILED DESCRIPTION

Figure 1A:
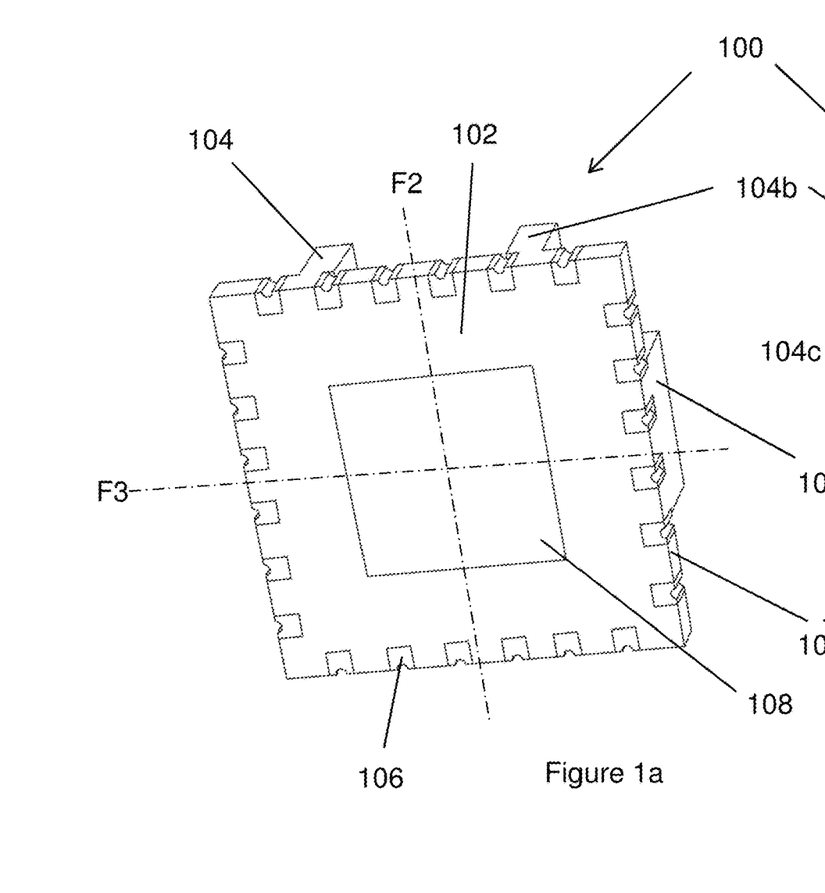
FIGS. 1a and 1b are front and rear perspective views of an individual microelectromechanical Systems (MEMS) inertial sensor package.
Figure 1B:
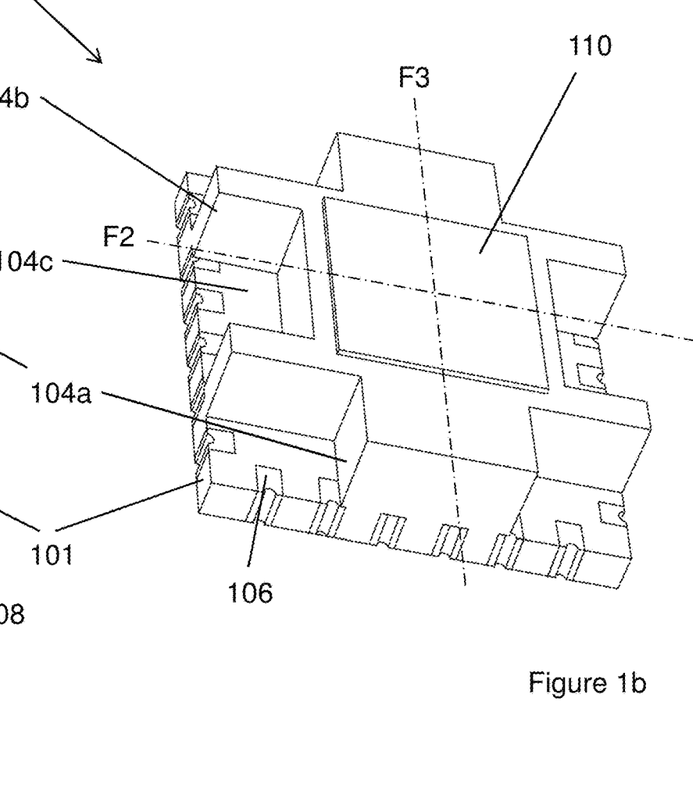

FIGS. 1a and 1b show an individual MEMS inertial sensor package 100 made up of a ceramic casing 101, which comprises a square base portion 102 on the front side of the package 100 and a series of mechanical interconnect features 104 on the rear side of the package 100. The mechanical interconnect features 104 comprise interlocking portions 104a extending along the axis F3, wall portions 104b extending parallel to the axis F2 and interlocking channels 104c defined between the wall portions 104b and aligned along the axis F2.

The sensor package 100 further comprises a plurality of L-shaped electrical interconnect features 106, for example conductive (e.g. metallic) pads, which are located at the edges of the base portion 102. It can be seen that the L-shaped electrical interconnect features 106 extend along the external front face to an edge of the package 100, continue across the edge, and further extend along a side face of the package 100. These electrical interconnect features 106 therefore extend up the side faces of the package 100 whereas conventional solder pads typically only extend to the edges of a front or rear face.

The ceramic casing 101 defines a front cavity 108 that extends from the front of the base portion 102 into the ceramic casing 101 and houses an integrated circuit, for example an application-specific integrated circuit (ASIC) (not shown). In addition, a rear cavity 110 extends into the rear of the casing 101 and houses a MEMS inertial sensor chip (not shown). Each cavity 108, 110 is hermetically sealed to protect the MEMS sensor chip and ASIC. Examples of different sealing methods are illustrated in FIGS. 2a, 2b and 2c, which show cross-sectional views of various MEMS inertial sensor packages 200, 230, 260 along the line labelled F2 in FIG. 1b.

As will be described in more detail below with reference to FIGS. 6 to 9, the mechanical interconnect features 104 enable several individual packages 100 to be assembled into a complete multi-axis Inertial Measurement Unit (IMU) with reduced alignment error.

Figure 2A:
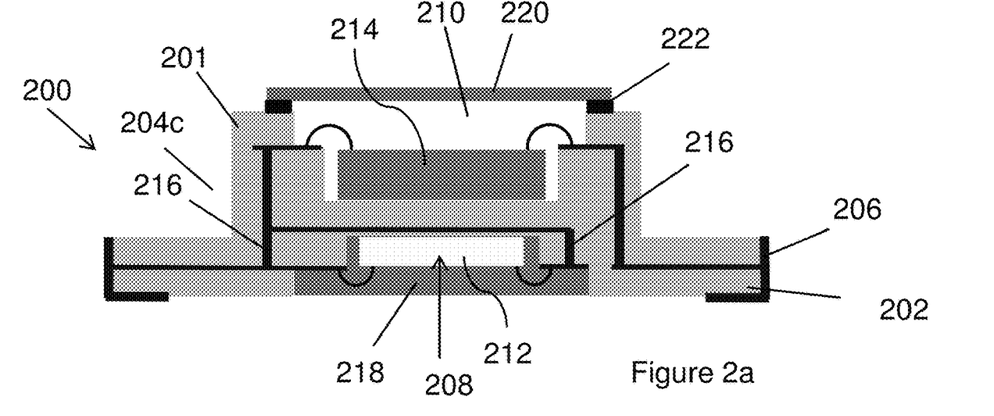
FIGS. 2a, 2b and 2c are cross-sectional views of different examples of individual MEMS inertial sensor packages.
Figure 2B:
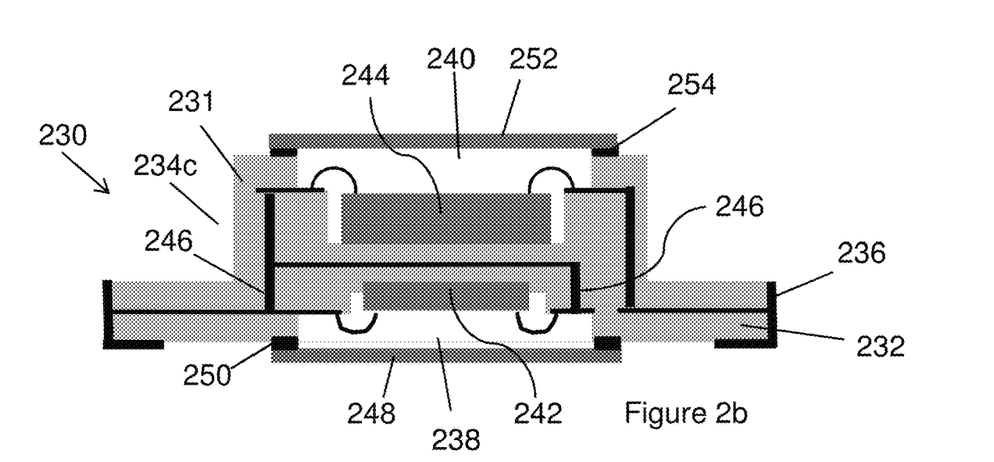
Figure 2C:
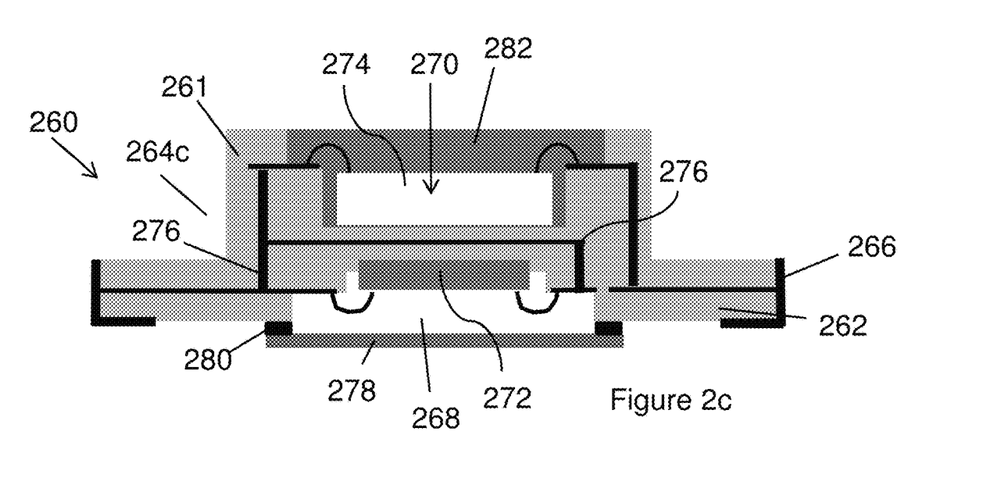

FIG. 2a shows a cross-sectional view of an individual MEMS inertial sensor package 200 comprising a ceramic casing 201, made up of a base portion 202 defining interlocking channels 204c, and front and rear cavities 208, 210. L-shaped electrical interconnect features 206 extend across the side faces of the base portion 202 and some distance across the front face of the base portion 202. An ASIC 212 is sealed within the front cavity 208, and a MEMS sensor chip 214 is sealed within the rear cavity 210. The ASIC 212 and the MEMS sensor chip 214 are electrically connected via internal metal tracking 216 ("vias") to the L-shaped electrical interconnect features 206.

In order to seal the package 200, the front cavity 208 is filled with a potting compound (such as epoxy) 218, which entirely encloses the ASIC 212. The rear cavity 210 is hermetically sealed using a glass or metal lid 220 and a lid seal 222.

FIG. 2b shows another MEMS inertial sensor package 230 with an alternative sealing arrangement. The package 230 again comprises a ceramic casing 231, made up of a base portion 232 defining interlocking channels 234c, and front and rear cavities 238, 240. L-shaped electrical interconnect features 236 extend across the side faces of the base portion 232 and some distance across the front face of the base portion 232. An ASIC 242 is sealed within the front cavity 238, and a MEMS sensor chip 244 is sealed within the rear cavity 240. The ASIC 242 and the MEMS sensor chip 244 are electrically connected via internal metal tracking 246 to the L-shaped electrical interconnect features 236. In this example, both the front cavity 238 and the rear cavity 240 are sealed with glass or metal lids 248, 252 and lid seals 250, 254.

FIG. 2c shows a further alternative MEMS inertial sensor package 260 comprising a ceramic casing 261, made up of a base portion 262 defining interlocking channels 264c, and front and rear cavities 268, 270. L-shaped electrical interconnect features 266 extend across the side faces of the base portion 262 and some distance across the front face of the base portion 262. An ASIC 272 is sealed within the front cavity 268, and a MEMS sensor chip 274 is sealed within the rear cavity 270. The ASIC 272 and the MEMS sensor chip 274 are electrically connected via internal metal tracking 276 to the L-shaped electrical interconnect features 266. In this example, the front cavity 268 is sealed with a glass or metal lid 278 and a lid seal 280, and the rear cavity 270 is filled with potting material (such as epoxy) 282.

Figure 3:
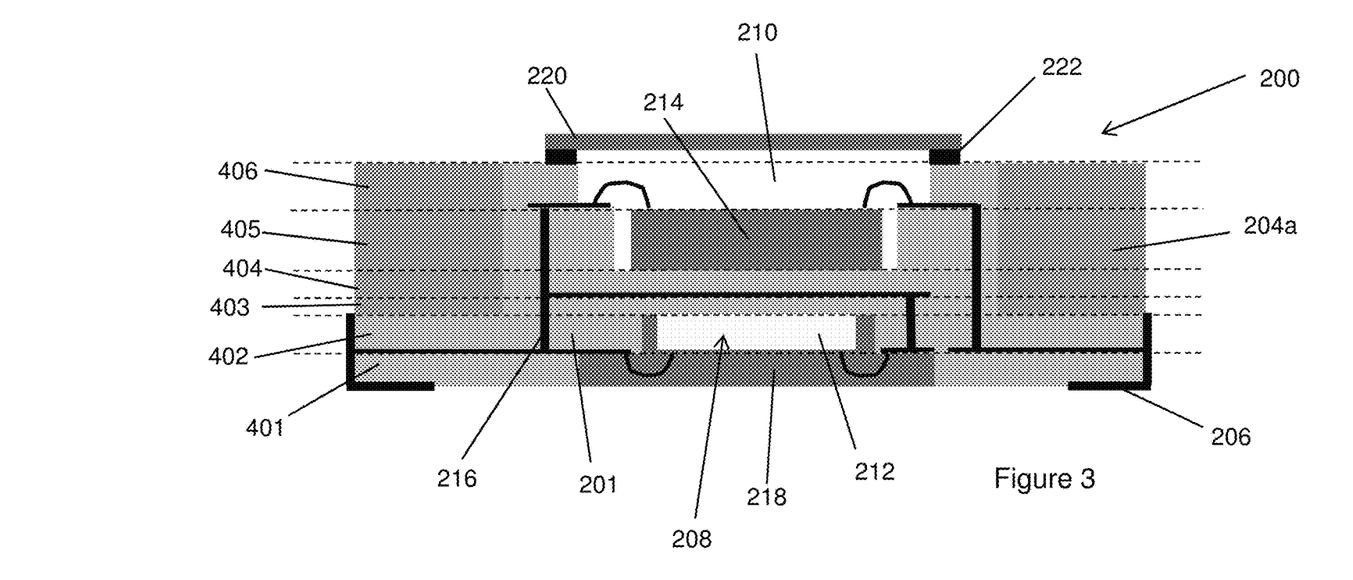
Figure 4A:
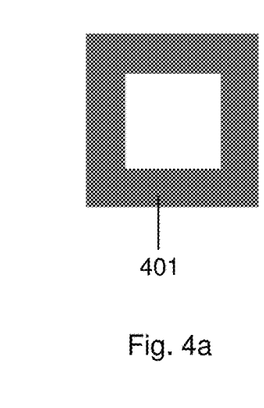
FIGS. 4a-f show the layers that make up the individual MEMS inertial sensor package shown in FIGS. 2a and 3.
Figure 4B:
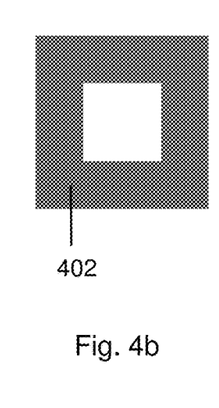
Figure 4C:
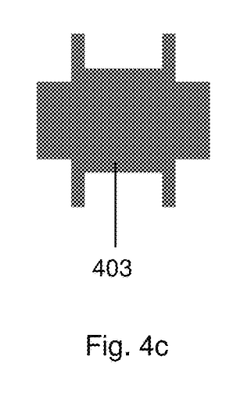
Figure 4D:
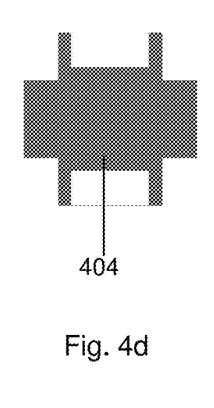
Figure 4E:
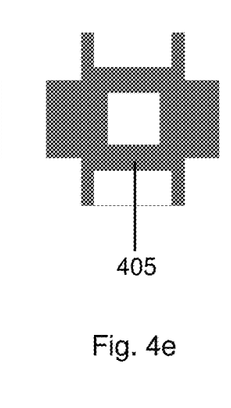
Figure 4F:
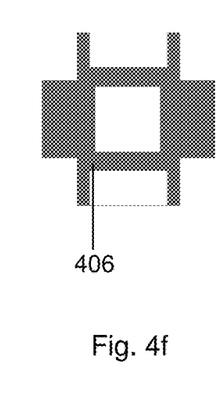

The construction of the MEMS inertial sensor package 200 shown in FIG. 2a will now be described in more detail with reference to FIGS. 3 and 4a-f. FIG. 3 shows an alternative cross-sectional view (along the line F3 shown in FIG. 1b) of the package 200, from which the interlocking portions 204a of the ceramic casing 201 are visible. The ceramic casing 201 is constructed from a stack of six ceramic package layers 401-406, which are depicted in FIGS. 4a-f. The first to sixth layers 401-406 include base layers 401-402 and further layers 403-406. It can be seen that the further layers 403-406 have a significantly different shape to the base layers 401-402 so as to define the mechanical interconnect features 204 such as the interlocking portions 204a of the ceramic casing 201 seen in FIG. 3. The shape of each layer 401-406 is designed to produce a ceramic casing 201 of the desired shape (e.g. correctly sized and positioned cavities and interconnect features).

Metal tracking 216 is added during the stacking of the package layers 401-406, to create internal electrical connections between different areas of the casing 201, which will later be used to electrically connect the MEMS sensor chip 214 to the ASIC 212 and to electrically connect both to the L-shaped electrical interconnect features 206.

Figure 5A:
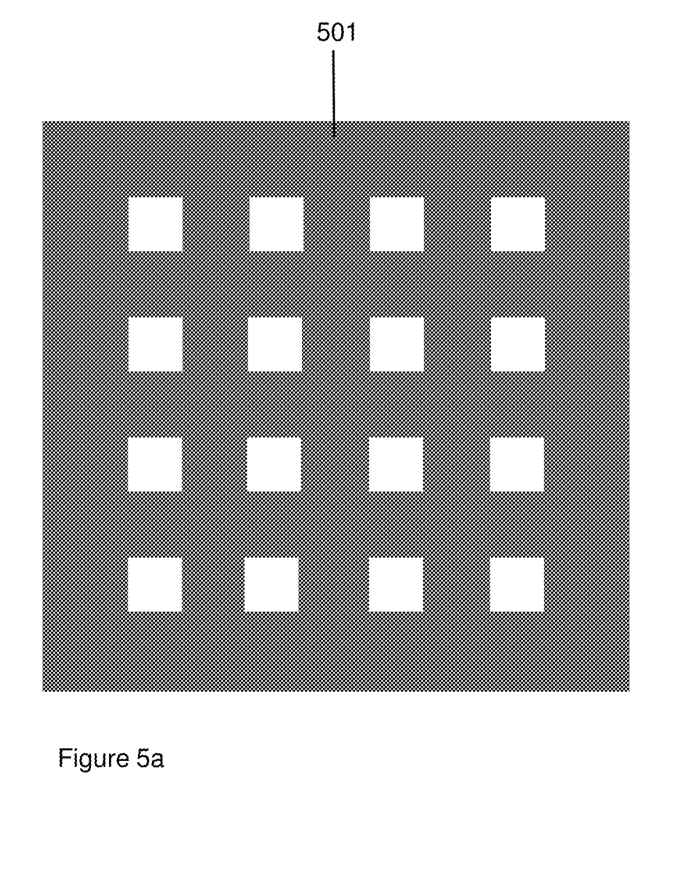
Figure 5B:
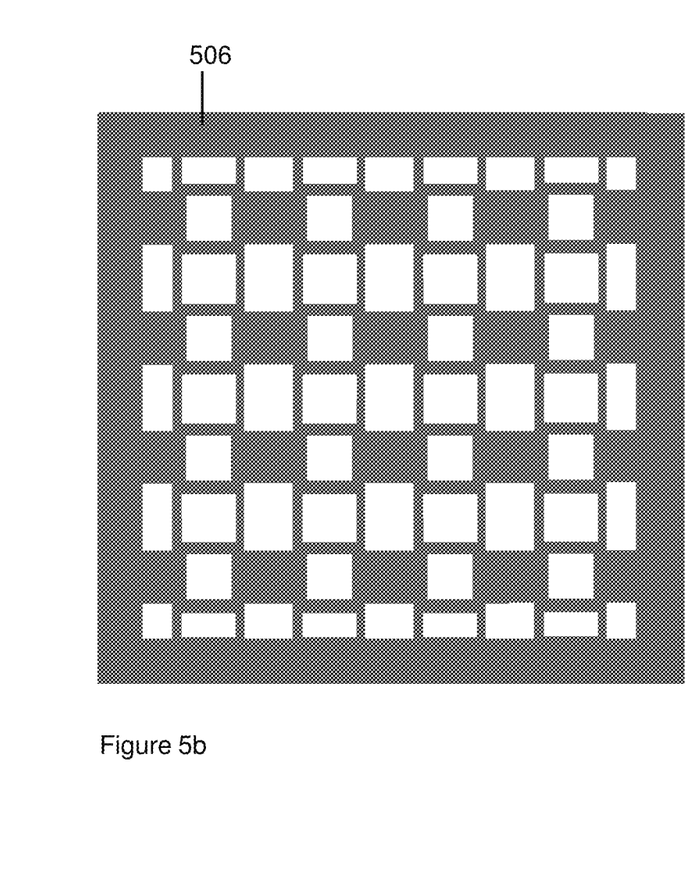
FIG. 5b shows a sheet of 16 layers as seen in FIG. 4f.

The package layers 401-406 are manufactured as multiple package layers in sheets, as shown in FIGS. 5a and 5b. FIG. 5a shows a sheet 501 of 16 first package layers 401, corresponding to the front-most layer of the package 200 (i.e. the front of the base portion 202). FIG. 5b shows a sheet 506 of 16 sixth package layers 406, corresponding to the rear-most layer of the package 200.

The individual sheets 501, 506 are manufactured using standard processes wherein unwanted material is stamped out of plain sheets of ceramic to form the required package layer shapes. Six such sheets, one of each package layer type (401-406), are then stacked, with electrical tracking 216 added where internal connections are required, to form an overall sheet (not shown) of 16 ceramic casings 201. As each subsequent ceramic sheet is stamped to remove material where none is required, it is necessary for the package design to ensure that each sheet will remain intact until the overall packages are formed in the final consolidated sheet. The individual sheets may be laminated together and sintered, to form a single consolidated sheet, before the 16 individual casings 201 are singulated or separated (e.g. by sawing or cleaving), ready for the next stage of manufacture.

Once the individual ceramic casings 201 have been formed, the ASIC 212 and the MEMS sensor chip 214 are inserted into the front and rear cavities 208, 210 respectively and connected to the internal electrical tracking 216. The front and rear cavities 208, 210 are then sealed with potting material 218 and a glass or metal lid 220 and lid seal 222 (e.g. as described above). Any of the sealing arrangements seen in FIGS. 2a-2c, or any other suitable sealing arrangement, may be used for the package 200. The L-shaped electrical interconnect features 206 are then added to complete the individual MEMS inertial sensor package 200.

Because the ceramic casings 201 are manufactured using standard ceramic packaging processes, there is no significant increase in manufacturing complexity, cost or time compared to producing standard ceramic packages.

Figure 6:
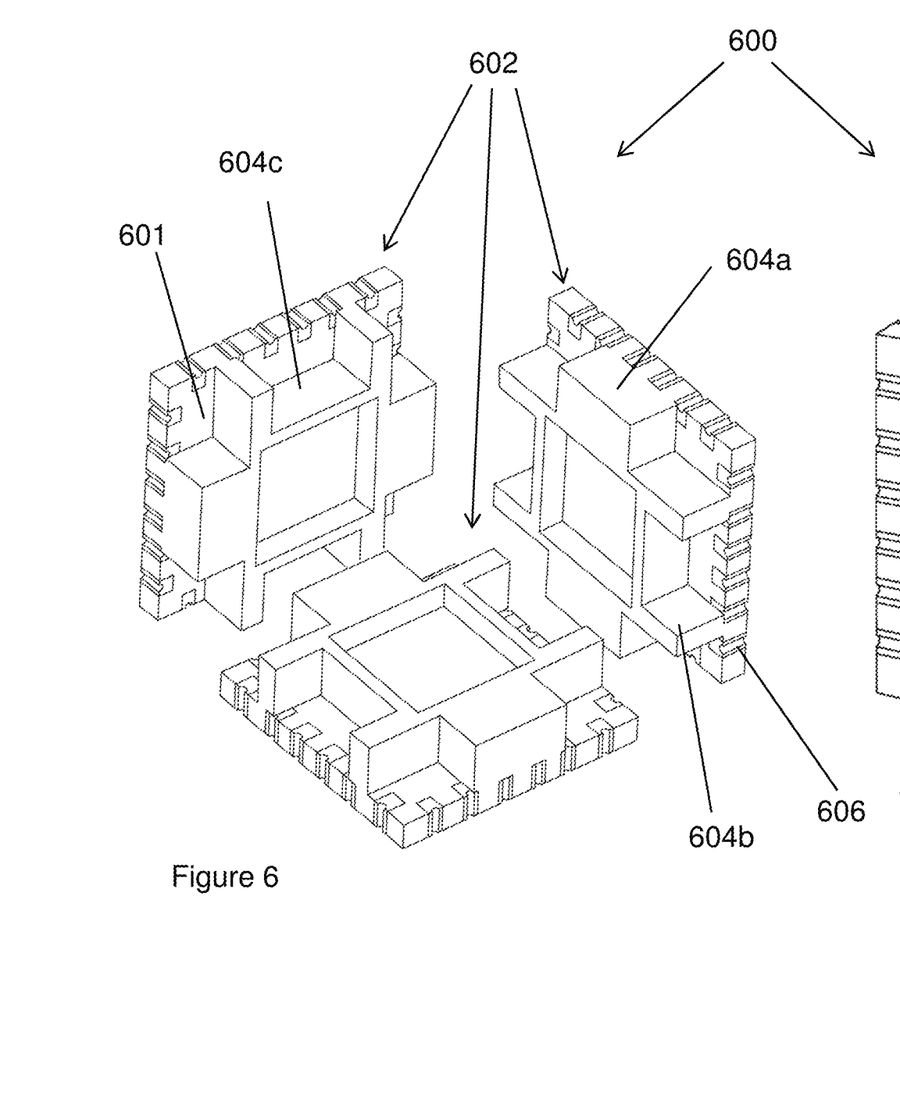
FIG. 6 is an exploded view of an example of a partially assembled inertial measurement unit comprising three individual MEMS inertial sensor packages.

As mentioned above, the mechanical interconnect features 204a (and 204b, 204c not seen in FIG. 3) of the ceramic casing 201 enable several identical packages 200 to be assembled into a multi-axis IMU, with the MEMS sensor chips 214 accurately oriented orthogonal to one another. FIG. 6 shows an exploded view of such a partially assembled IMU 600, made up of three individual packages 602. The packages 602 each comprise a ceramic casing 601 featuring mechanical interconnect features 604a, 604b, 604c, and a plurality of L-shaped electrical interconnect features 606. The IMU 600 is assembled by bringing the three packages 602 together such that at least one interlocking portion 604a interlocks with a corresponding interlocking channel 604c in the casing 601 of an adjacent package 602, which fixes their relative position in a mutually orthogonal orientation.

Figure 7:
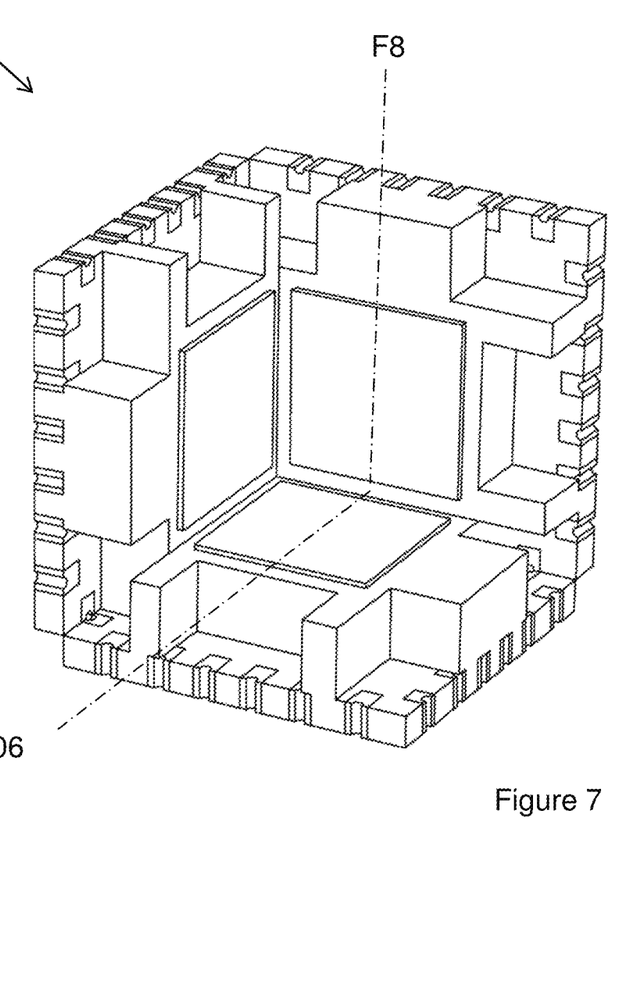
FIG. 7 shows the partially assembled inertial measurement unit comprising three individual MEMS inertial sensor packages.
Figure 8:
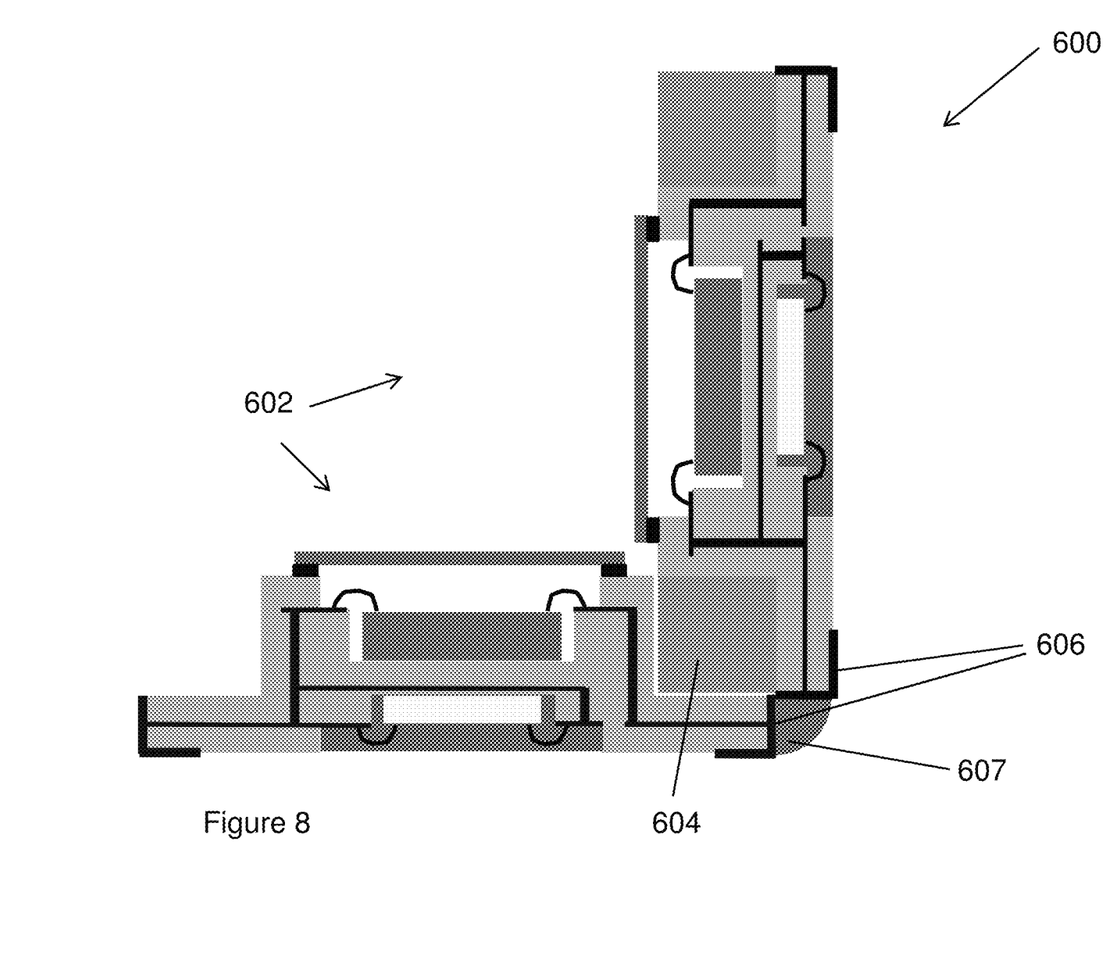
FIG. 8 is a cross-sectional view of the partially assembled inertial measurement unit shown in FIG. 7.

FIG. 7 shows the partially assembled state of the IMU 600 of FIG. 6. As mentioned above, the interconnection of the mechanical interconnect features 604a, 604b, 604c fixes the relative orientation of the three packages 602, consequently ensuring that the orientations of the MEMS sensor chips carried in the packages 600 are accurately orthogonal (i.e. one MEMS sensor chip is exactly aligned along each of the x, y and z axes). FIG. 8, which shows a cross-section of the partially assembled IMU 600 along line F8 in FIG. 7, illustrates in greater detail how the interlocking portion 604a of one package 602 interlocks with an interlocking channel 604c of the adjacent package 602 to ensure that the packages 602, and thus the MEMS sensor chips sealed therewithin, are fixed to be accurately orthogonal to one another. This reduces alignment errors and increases the ease of assembly, e.g. as compared with the previous approach of affixing standard individual MEMS sensor packages to a pre-assembled (e.g. cubic) mounting structure. Furthermore, by eliminating an underlying mounting structure any material mismatch is removed so the problem of differential thermal expansion in the IMU is greatly reduced. It will be appreciated that during assembly of the IMU 660, each ceramic package 602 is directly connected to another ceramic package 602 made of the same material in the same manufacturing process.

Because the MEMS sensor packages 602 are manufactured individually, they may also be tested individually before assembly of the IMU 600, to ensure that each sensor package 602 is operating correctly and to the required accuracy. If one package 602 is defective, a replacement (fully operational) package 602 may simply be used in its place during assembly.

As seen in FIG. 8, when the IMU 600 is being assembled, the L-shaped electrical interconnect features 606 of adjacent packages 600 are positioned to align and to abut. Solder is added to join each set of aligned L-shaped electrical interconnect features 606 to form a plurality of solder joints 607, which electrically interconnect each package 602 to the adjacent ones. All of the packages 602 may be electrically interconnected together to form a bus (e.g. for the transfer of power and/or data). The solder joints 607 may also serve a structural purpose, helping to hold each of the packages 602 in place within the self-supporting cluster.

Figure 9:
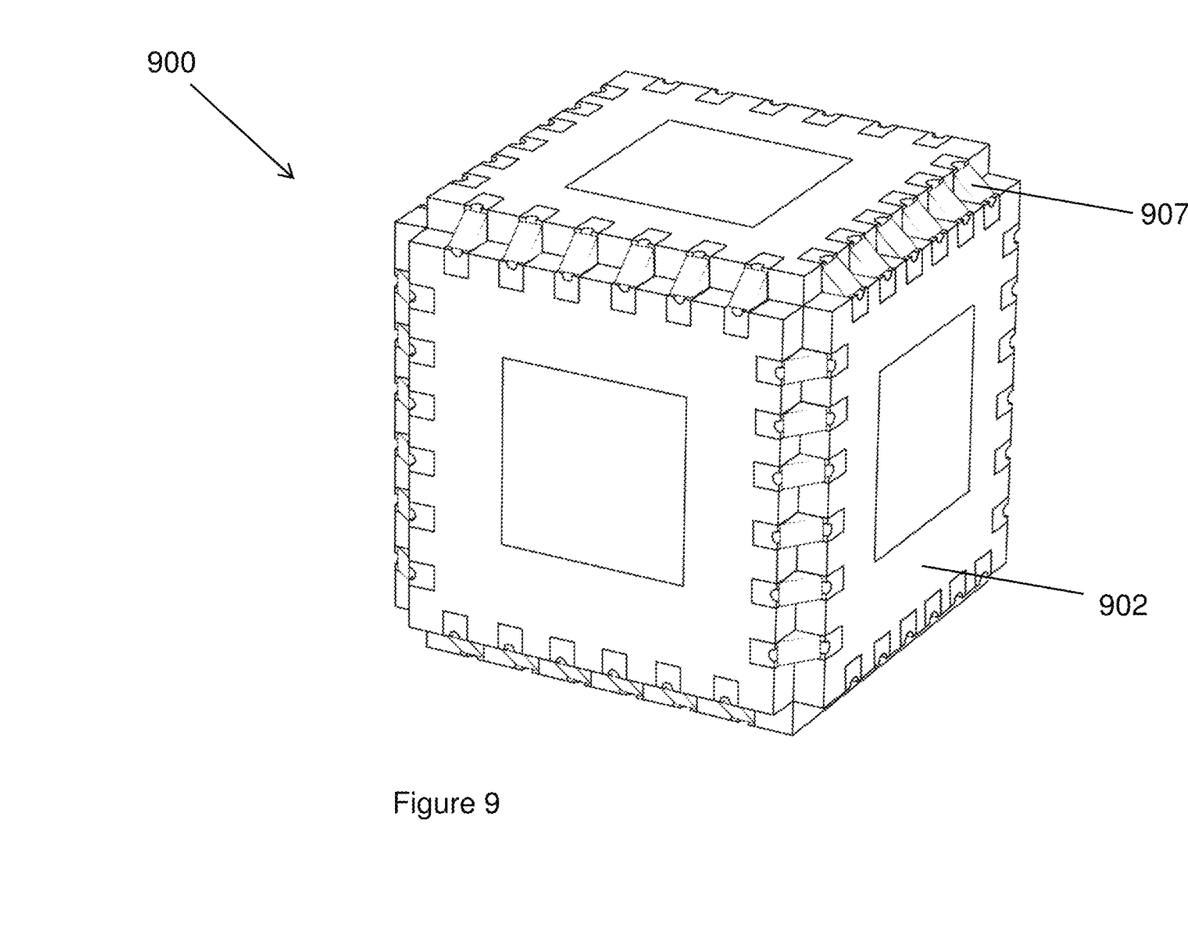
FIG. 9 shows a fully assembled inertial measurement unit comprising six individual MEMS inertial sensor packages.

FIG. 9 shows a fully assembled cubic IMU 900 comprising six MEMS sensor packages 902 mechanically interconnected together (by the mechanical interconnect features hidden inside the cube) and electrically interconnected together by the solder joints 907. As with the partially assembled IMU 600 described above with reference to FIG. 6, mechanical interconnect features (not visible) on the rear side of each of the packages 902 are interlocked, which ensures that the packages 902 are orientated mutually orthogonally. The provision of six packages 902 enables the IMU 900 to comprise, for example, three MEMS linear accelerometers and three MEMS angular rate sensors ("gyros") in a compact orthogonal layout with minimal alignment errors. Providing three linear accelerometers and three angular rate sensors in such a way enables the IMU 900 to provide accurate motion information for all six degrees of freedom, with reduced space requirements.

The complete IMU 900 may then be connected to a suitable IMU control system (not shown) which allows each sensor package 902 to be separately controlled. In examples wherein the packages 902 are connected together so as to form a bus for the transfer of power and/or data between the packages, the IMU may only need a single shared power and/or data connection to the IMU control system.

The invention claimed is:

1. A method of manufacturing an inertial measurement unit (IMU) comprising:
    fabricating a plurality of individual MEMS inertial sensor packages at a package level as sealed packages containing a MEMS inertial sensor chip and an integrated circuit electrically connected together,
    wherein fabricating the individual MEMS inertial sensor packages comprises forming a set of mechanical interconnect features in each package such that each of the plurality of individual MEMS inertial packages is an entirely separate package comprising its own independent set of mechanical interconnect features; and
    assembling the IMU by mechanically interconnecting the at least one mechanical interconnect feature of the set of mechanical interconnect features of each of the plurality of individual MEMS inertial sensor packages with at least one mechanical interconnect feature of the independent set of mechanical interconnect features of another of the plurality of individual MEMS inertial sensor packages, wherein the mechanical interconnect features fix the orientation of the individual MEMS inertial sensor packages relative to one another so as to be mutually orthogonal;
    wherein any one of the plurality of individual MEMS inertial sensor packages can be individually replaced prior to assembling the IMU with a replacement individual MEMS inertial sensor package comprising its own independent set of mechanical interconnect features.

2. The method of claim 1, further comprising:
    testing each of the plurality of individual MEMS inertial sensor packages before assembling the IMU.

3. The method of claim 1, wherein fabricating the individual MEMS inertial sensor packages comprises layer-by-layer fabrication.

4. The method of claim 1, wherein fabricating the individual MEMS inertial sensor packages comprises:
    stacking a plurality of package layers comprising one or more base layers and one or more further layers having a different shape to the one or more base layers.

5. The method of claim 4, wherein the mechanical interconnect features are formed as a result of the different shape of the one or more further layers.

6. The method of claim 1, wherein the mechanical interconnect features are formed at one or more edges of each package.

7. The method of claim 1, wherein the mechanical interconnect features in each package comprise at least one interlocking portion and at least one corresponding interlocking channel, the method further comprising:
    assembling the IMU by mechanically interconnecting an interlocking portion of one package with a corresponding interlocking channel of another package.

8. The method of claim 1, wherein fabricating the individual MEMS inertial sensor packages comprises:
    stacking a plurality of package layers, each package layer comprising multiple package layers formed in a sheet, to fabricate multiple packages in a single consolidated sheet.

9. The method of claim 8, further comprising:
singulating the individual packages from the single consolidated sheet and sealing the MEMS inertial sensor chip and the integrated circuit into each individual package.

10. The method of claim 1, wherein fabricating the individual MEMS inertial sensor packages comprises:
adding electrical interconnect features to one or more external faces of each package.

11. The method of claim 10, further comprising:
directly joining the electrical interconnect features of one package to the electrical interconnect features of another package.

12. The method of claim 11, further comprising:
joining a vertical side face of one package to a horizontal side face of another package.

13. The method of claim 1, further comprising:
electrically connecting each individual MEMS inertial sensor package with one or more others of the plurality of individually fabricated MEMS inertial sensor packages so as to form a bus for the transfer of power and/or data between the packages.

14. An inertial measurement unit (IMU) comprising:
a plurality of individually fabricated MEMS inertial sensor packages;
wherein each package is individually fabricated at a package level as a sealed package containing a MEMS inertial sensor chip and an integrated circuit electrically connected together; and
wherein each individually fabricated MEMS inertial sensor package comprises a set of mechanical interconnect features, such that each of the plurality of individual MEMS inertial packages is an entirely separate package comprising its own independent set of mechanical interconnect features;
wherein at least one mechanical interconnect feature of the set of mechanical interconnect features of each of the plurality of individual MEMS inertial sensor packages is mechanically interconnected with at least one mechanical interconnect feature of the independent set of mechanical interconnect features of another of the plurality of individual MEMS inertial sensor packages, wherein the mechanical interconnect features fix the orientation of the individual MEMS inertial sensor packages relative to one another so as to be mutually orthogonal.

15. The IMU of claim 14, wherein each individually fabricated MEMS inertial sensor package further comprises electrical interconnect features on one or more external faces of the package and the electrical interconnect features of one package are directly joined to the electrical interconnect features of another package, for example the electrical interconnects are directly joined from a vertical side face of one package to a horizontal side face of another package.

16. The IMU of claim 15, wherein each individual MEMS inertial sensor package is electrically connected with one or more others of the plurality of individually fabricated MEMS inertial sensor packages so as to form a bus for the transfer of power and/or data between the packages.

17. The IMU of claim 14, wherein each individual MEMS inertial sensor package is electrically connected with one or more others of the plurality of individually fabricated MEMS inertial sensor packages so as to form a bus for the transfer of power and/or data between the packages.

* * * * *